(12) United States Patent
Lim et al.

(10) Patent No.: US 8,110,830 B2
(45) Date of Patent: Feb. 7, 2012

(54) THIN FILM TRANSISTOR ARRAY SUBSTRATE AND METHOD OF MANUFACTURING THE SAME

(75) Inventors: Joo Soo Lim, Gyeonggi-do (KR); Hyun Seok Hong, Gyeonggi-Do (KR); Chang Bin Lee, Busan (KR)

(73) Assignee: LG Display Co., Ltd., Seoul (KR)

( * ) Notice: Subject to any disclaimer, the term of this patent is extended or adjusted under 35 U.S.C. 154(b) by 845 days.

(21) Appl. No.: 12/003,626

(22) Filed: Dec. 28, 2007

(65) Prior Publication Data
US 2008/0169470 A1    Jul. 17, 2008

(30) Foreign Application Priority Data
Dec. 29, 2006  (KR) .................... 10-2006-0138541

(51) Int. Cl.
  *H01L 21/00*  (2006.01)
  *H01L 33/00*  (2010.01)
(52) U.S. Cl. ........... 257/59; 257/E21.001; 257/E23.001; 438/30; 438/149; 438/155; 438/158
(58) Field of Classification Search .................. 257/59, 257/E21.001, E23.001; 438/30, 149, 155, 438/158
See application file for complete search history.

(56) References Cited

U.S. PATENT DOCUMENTS
| | | | |
|---|---|---|---|
| 2005/0077516 A1 | 4/2005 | Lim et al. | |
| 2005/0095759 A1* | 5/2005 | Cho et al. | 438/158 |
| 2006/0145161 A1* | 7/2006 | Lee et al. | 257/72 |

FOREIGN PATENT DOCUMENTS
| | | |
|---|---|---|
| CN | 1808266 A | 7/2006 |
| JP | 2006-189811 A | 7/2006 |
| KR | 1020050068466 A | 5/2005 |
| KR | 1020050058042 A | 6/2005 |

OTHER PUBLICATIONS

Taiwanese Office Action dated Jun. 8, 2011.

* cited by examiner

*Primary Examiner* — Hung Vu
*Assistant Examiner* — Vernon P Webb
(74) *Attorney, Agent, or Firm* — Morgan, Lewis & Bockius LLP

(57) ABSTRACT

A thin film transistor (TFT) array substrate and a method of manufacturing the same that is capable of decreasing the number of usage of exposure masks to reduce the process time and the process costs and excessively etching a passivation film below a photoresist pattern to easily perform a lift-off process of the photoresist pattern are disclosed. The TFT array substrate includes a gate line layer including a gate line formed on a substrate, a gate electrode diverging from the gate line, and a gate pad formed at the end of the gate line, a gate insulation film formed on the gate line layer, a semiconductor layer formed on the gate insulation film above the gate electrode, a data line layer including a data line intersecting the gate line, source and drain electrodes formed at opposite sides of the semiconductor layer, and a data pad formed at the end of the data line, a pixel electrode contacting the drain electrode, first and second oxidation preventing films contacting the gate pad and the data pad, and an at least two-layered passivation film deposited on the data line layer. The uppermost layer of the at least two-layered passivation film is formed at the remaining region excluding a region where the pixel electrode and the first and second oxidation preventing films are formed.

9 Claims, 21 Drawing Sheets

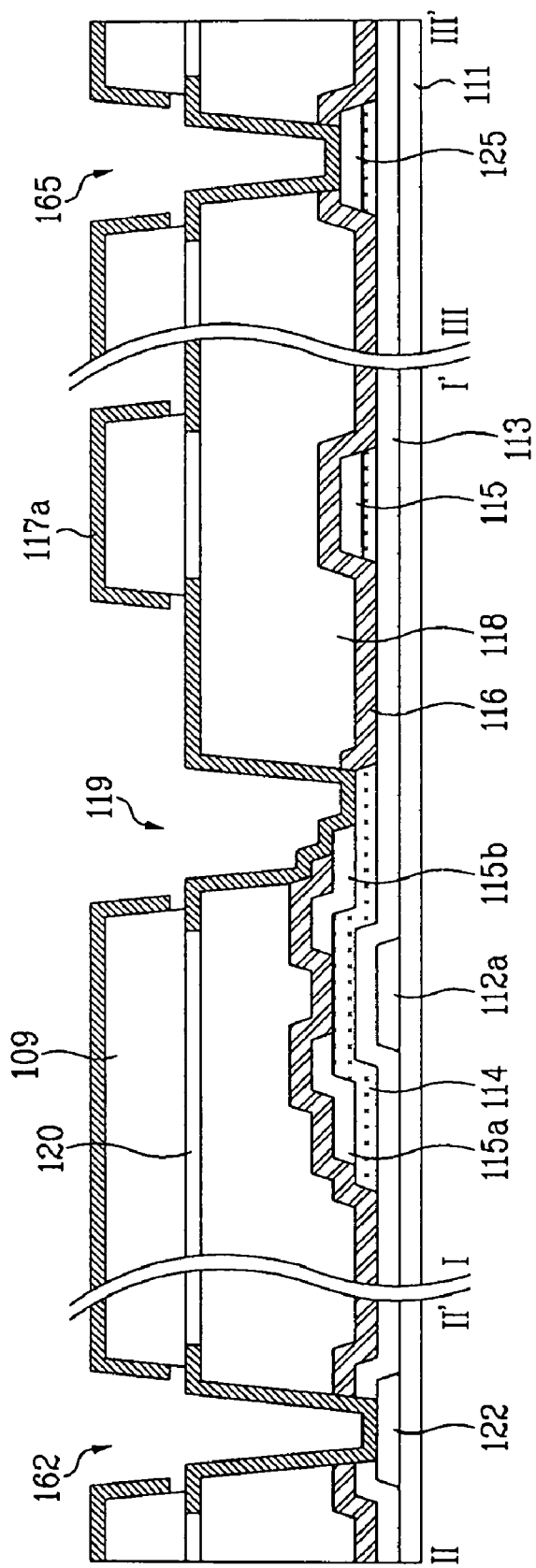

THIN FILM TRANSISTOR ARRAY SUBSTRATE AND METHOD OF MANUFACTURING THE SAME

CROSS-REFERENCE TO RELATED APPLICATION

This application claims the benefit of Korean Patent Application No. 2006-138541, filed on Dec. 29, 2006, which is hereby incorporated by reference in its entirety as if fully set forth herein.

BACKGROUND OF THE INVENTION

1. Field of the Invention

The present invention relates to a liquid crystal display device (LCD), and more particularly, to a thin film transistor (TFT) array substrate and a method of manufacturing the same that is capable of decreasing the number of usage of exposure masks to reduce the process time and the process costs and excessively etching a passivation film below a photoresist pattern to easily perform a lift-off process of the photoresist pattern.

2. Discussion of the Related Art

A liquid crystal display device has a high contrast ratio, is suitable for gradation display or motion picture display, and has low power consumption. For this reason, relative importance of the liquid crystal display device is being increased among flat panel display devices.

In such a liquid crystal display device, various patterns, such as drive devices or lines, are formed on a substrate for performing an operation. One of general technologies used to form patterns is photolithography.

The photolithography includes a series of complicated processes for applying photoresist, a material which is exposed to ultraviolet rays, to a film layer on a substrate to which patterns will be formed, developing the photoresist by exposing a pattern formed at an exposure mask on the photoresist, etching the film layer using the patterned photoresist as a mask, and stripping the photoresist.

In a conventional thin film transistor (TFT) array substrate for liquid crystal display devices, five to seven mask technologies are normally used to form a gate line layer, a gate insulation film, a semiconductor layer, a data line layer, a passivation film, and a pixel electrode on a substrate. As the number of usage of photolithography using masks is increased, a probability of process error is increased.

In order to solve the above-mentioned problem, research has been conducted on a low-mask technology for minimizing the number of photolithography processes to increase the productivity and secure the process margin.

Hereinafter, a method of manufacturing a conventional TFT array substrate will be described with reference to the accompanying drawings.

FIGS. 1A to 1E are sectional views illustrating a process for manufacturing the conventional TFT array substrate.

So as to form the conventional TFT array substrate, which is used for liquid crystal display devices, as shown in FIG. 1A, a low-resistance metal material, such as copper (Cu), aluminum (Al), aluminum alloy (AlNd), molybdenum (Mo), or chrome (Cr), is deposited on a substrate 11. Subsequently, a plurality of gate lines (not shown), a gate electrode 12a, and a gate pad 22 are formed on the deposited metal material through a photolithography process and an etching process using a first mask.

The photolithography process and the etching process are performed as follows.

A low-resistance metal material is deposited on a transparent glass substrate 11 having high heat resistance at high temperature. Photoresist is applied to the deposited metal material. A first mask having a pattern layer is placed on the photoresist, and light is selectively irradiated to the photoresist. As a result, the same pattern as the first mask is formed on the photoresist.

Subsequently, the photoresist to which the light was irradiated is removed using a developing solution so as to pattern the photoresist. The metal material exposed through the patterned photoresist is selectively etched so as to obtain a desired pattern.

Subsequently, as shown in FIG. 1B, an inorganic material, such as silicon nitride (SiNx) or silicon oxide (SiOx), is deposited on the front surface of the substrate 11 including the gate electrode 12a at high temperature so as to form a gate insulation film 13.

Subsequently, amorphous silicon is deposited on the gate insulation film 13, and the amorphous silicon is patterned through a photolithography process using a second mask so as to form an island-shaped semiconductor layer 14 on the gate insulation film 13 such that the semiconductor layer 14 overlaps with the gate electrode 12a.

Subsequently, as shown in FIG. 1C, a low-resistance metal material, such as copper (Cu), aluminum (Al), aluminum alloy (AlNd), molybdenum (Mo), or chrome (Cr), is deposited on the front surface of the substrate 11 including the semiconductor layer 14, and then a data line layer is formed on the deposited metal material through a photolithography process using a third mask.

The data line layer includes data lines (not shown) intersecting the gate lines for defining a unit pixel region, a source electrode 15a overlapping with the edge of the semiconductor layer 14, a drain electrode 15b, and a data pad 25 located at a pad region.

The gate electrode 12a, the gate insulation film 13, the semiconductor layer 14, the source electrode 15a, and the drain electrode 15b, which are deposited as described above, constitute a thin film transistor that controls on/off of voltage applied to the unit pixel.

Subsequently, as shown in FIG. 1D, an organic insulating material, such as benzocyclobutene (BCB), or an inorganic insulating material, such as silicon nitride (SiNx), is deposited on the front surface of the substrate 11 including the drain electrode 15b so as to form a passivation film 16. The passivation film 16 is partially removed through a photolithography process using a fourth mask so as to form a contact hole 71 through which the drain electrode 15b is exposed, a first pad opening region 81a through which the gate pad 22 is exposed, and a second pad opening region 81b through which the data pad 25 is exposed.

Subsequently, as shown in FIG. 1E, a transparent conductive material, such as indium tin oxide (ITO) or indium zinc oxide (IZO), is deposited on the front surface of the substrate 11 including the passivation film 16, and a pixel electrode 17 is formed at a pixel region, such that the pixel electrode 17 is electrically connected to the drain electrode 15b, through a photolithography process using a fifth mask, thereby completing a TFT array substrate. At the same time, a transparent conductive layer 27 is formed for covering the first and second pad opening regions 81a and 81b to prevent the oxidation of the gate pad 22 and the data pad 25.

In the conventional TFT array substrate for liquid crystal display devices, the exposure masks are used at least five times so as to form the gate line layer, the semiconductor layer, the data line layer, the contact hole of the passivation film, and the pixel electrode. When the number of usage of the exposure masks is increased, the process for manufacturing the TFT array substrate is complicated with the result that the process time and the process costs are increased. Consequently, the process efficiency is greatly lowered.

SUMMARY OF THE INVENTION

Accordingly, the present invention is directed to a thin film transistor (TFT) array substrate and a method of manufacturing the same that substantially obviate one or more problems due to limitations and disadvantages of the related art.

An object of the present invention is to provide a TFT array substrate and a method of manufacturing the same that is capable of patterning a gate line layer using a first exposure mask, forming an etching stopper using a second exposure mask, patterning a semiconductor layer, n+a-Si, and a data line layer using a third exposure mask, and patterning a pixel electrode and oxidation preventing films using a fourth exposure mask in a batch fashion, i.e., forming the TFT array substrate using exposure masks a total of four times, thereby simplifying the process and reducing the process costs.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a TFT array substrate includes a gate line layer including a gate line formed on a substrate, a gate electrode diverging from the gate line, and a gate pad formed at the end of the gate line, a gate insulation film formed on the gate line layer, a semiconductor layer formed on the gate insulation film above the gate electrode, a data line layer including a data line intersecting the gate line, source and drain electrodes formed at opposite sides of the semiconductor layer, and a data pad formed at the end of the data line, a pixel electrode contacting the drain electrode, first and second oxidation preventing films contacting the gate pad and the data pad, and an at least two-layered passivation film deposited on the data line layer. The uppermost layer of the at least two-layered passivation film is formed at the remaining region excluding a region where the pixel electrode and the first and second oxidation preventing films are formed.

In another aspect of the present invention, a method of manufacturing a TFT array substrate includes forming a gate line layer including a gate line, a gate electrode, and a gate pad on a substrate, forming a gate insulation film on the front surface of the substrate including the gate line layer, forming a semiconductor layer overlapping with the gate electrode, forming a data line layer including a data line intersecting the gate line, source and drain electrodes disposed at opposite sides of the semiconductor layer, and a data pad formed at the end of the data line, forming an at least two-layered passivation film on the front surface of the substrate including the data line layer, forming a photoresist pattern on the uppermost layer of the at least two-layered passivation film, selectively etching the at least two-layered passivation film using the photoresist pattern as a mask to form a contact hole and first and second opening regions and, at the same time, excessively etching the uppermost layer of the at least two-layered passivation film below the photoresist pattern in the horizontal direction, depositing a conductive material on the front surface of the substrate including the photoresist, and patterning the conductive material by lifting off the photoresist to form a pixel electrode contacting the drain electrode through the contact hole and first and second oxidation preventing films contacting the gate pad and the data pad through the first and second opening regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 5A to 5H are sectional views illustrating a process for manufacturing the TFT array substrate according to the first embodiment of the present invention.

DETAILED DESCRIPTION OF THE INVENTION

Reference will now be made in detail to the preferred embodiments of the present invention, examples of which are illustrated in the accompanying drawings. Whenever possible, the same reference numbers will be used throughout the drawings to refer to the same or like parts.

First Embodiment

Figure 1A:
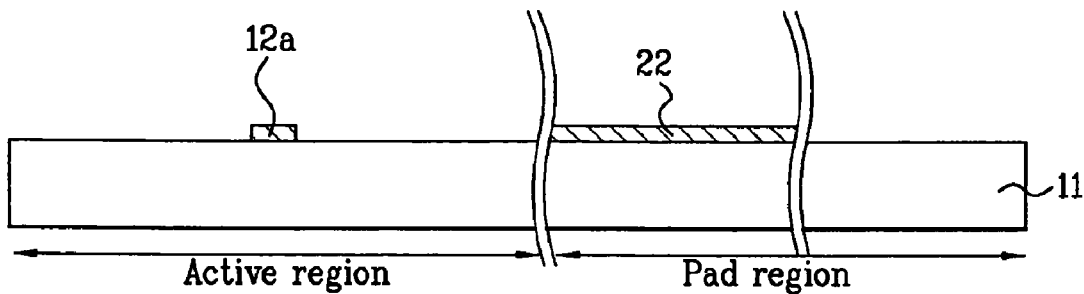
FIGS. 1A to 1E are sectional views illustrating a process for manufacturing a conventional thin film transistor (TFT) array substrate.
Figure 1B:
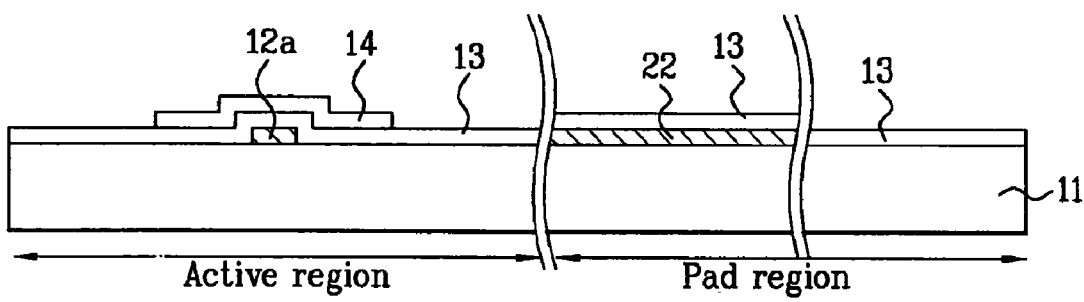
Figure 1C:
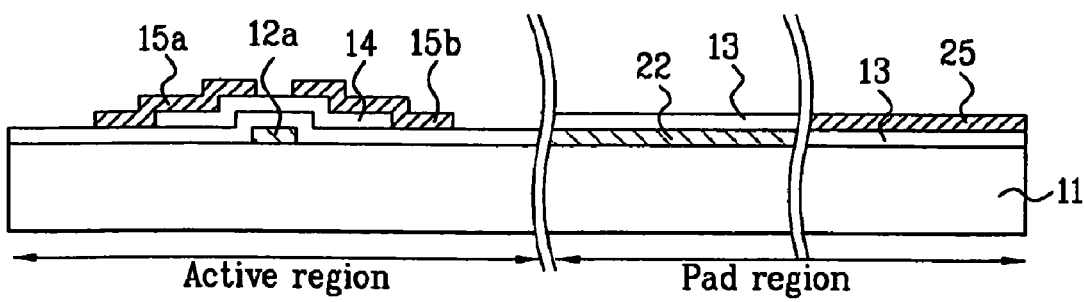
Figure 1D:
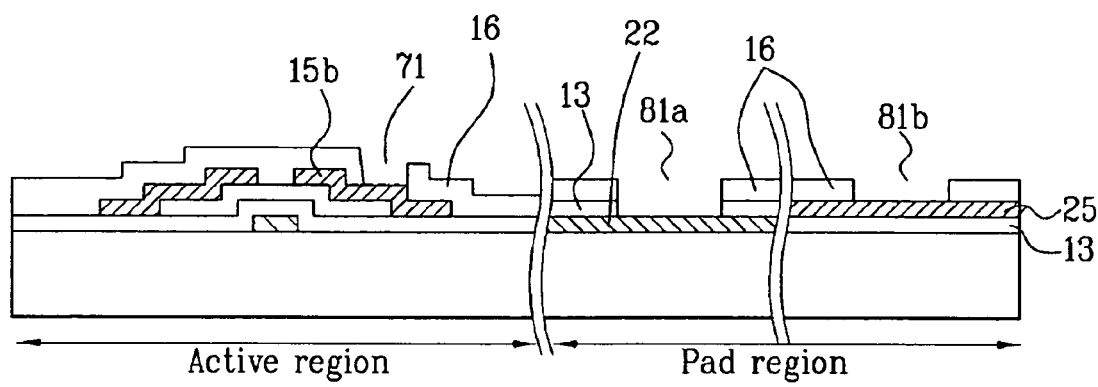
Figure 1E:
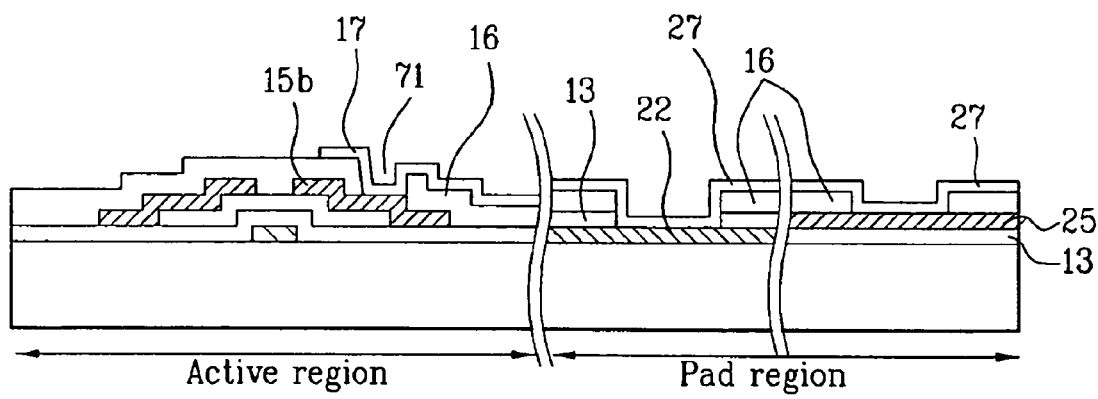
Figure 2:
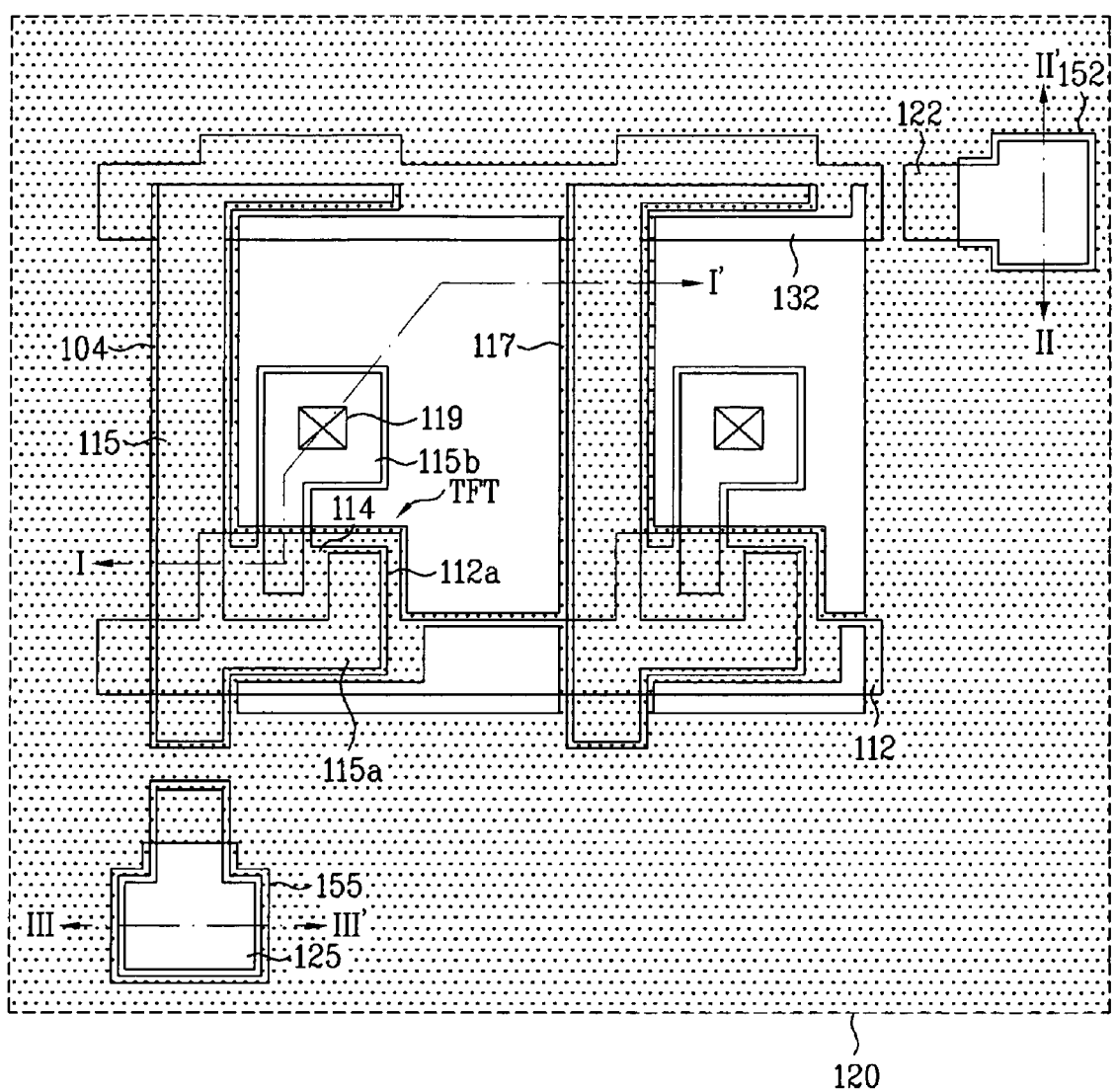
FIG. 2 is a plan view illustrating a TFT array substrate according to a first embodiment of the present invention.
Figure 3:
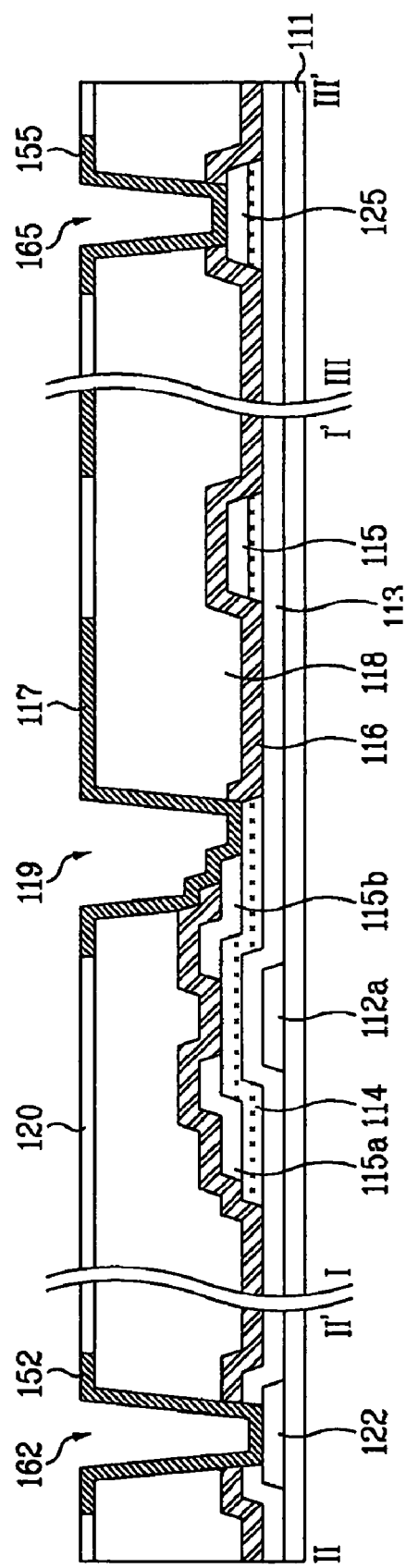
FIG. 3 is a sectional view of the TFT array substrate taken along lines I-I', II-II', and III-III' of FIG. 2.

FIG. 2 is a plan view illustrating a TFT array substrate according to a first embodiment of the present invention, FIG. 3 is a sectional view of the TFT array substrate taken along lines I-I', II-II', and III-III' of FIG. 2, FIGS. 4A to 4C are plan views illustrating a process for manufacturing the TFT array substrate according to the first embodiment of the present invention, and FIGS. 5A to 5H are sectional views illustrating a process for manufacturing the TFT array substrate according to the first embodiment of the present invention.

As shown in FIGS. 2 and 3, the TFT array substrate for liquid crystal display devices according to the first embodiment of the present invention is divided into an active region at which a thin film transistor (TFT), a pixel electrode 117, a gate line 112, and a data line 115 are formed and a pad region at which a gate pad 122 and a data pad (DP) 125 are formed.

Specifically, a sub-pixel is defined by the gate line 112 and the data line 115, which intersect each other, on the active region. At the intersection of the two lines 112 and 115 are deposited a gate electrode 112a, a gate insulation film 113, a semiconductor layer 114, and source and drain electrodes 115a and 115b to constitute the TFT. At this time, a photolithography process using a diffraction exposure mask is performed so as to pattern the semiconductor layer 114 and the source and drain electrode 115a and 115b, which have different patterns, in a batch fashion. It can be seen from FIGS. 2 and 3 that some edges of the semiconductor 114 and the source and drain electrodes 115a and 115b are located on the same line, and, in addition, amorphous silicon 104 is formed below the data line 115 in the same pattern.

A first passivation film 116, which is formed by depositing an inorganic insulating material, such as silicon nitride (SiNx) or silicon oxide (SiOx), a second passivation film 118, which is formed by applying an organic insulating material, such as benzocyclobutene (BCB) or acrylic resin, and a third passivation film 120, which is formed by depositing silicon dioxide (SiO2), are sequentially deposited on the data line layer. At this time, it is required for the third passivation film 120 to be made of a material having an etching selectivity different from that of the second passivation film 118 and photoresist and to be made of a material having an etching selectivity similar to that of the first passivation film 116. As a result, it is possible to form the pixel electrode 117 and oxidation preventing films 152 and 155 through a lift-off process of the photoresist pattern, which will be described below in connection with a method of manufacturing the TFT array substrate.

The pixel electrode 117 is located on the second passivation film 118 at a region where the third passivation film 120 is removed. The pixel electrode 117 contacts the drain electrode 115b through a contact hole 119, which is formed by removing the first to third passivation films 116, 118, and 120.

On the other hand, the gate pad 122, which extends from the gate line 112 for transmitting a scan signal from an external drive circuit, and the data pad 125, which extends from the data line 115 for transmitting a video signal from the external drive circuit, are located on the pad region. The first and second oxidation preventing films 152 and 155 are formed on the gate pad 122 and the data pad 125 for covering the gate pad 122 and the data pad 125, respectively. The first oxidation preventing film 152 contacts the gate pad 122 through a first opening region 162 which is formed by removing the first to third passivation films 116, 118, and 120 and the gate insulation film 113. The second oxidation preventing film 155 contacts the data pad 125 through a second opening region 165 which is formed by removing the first to third passivation films 116, 118, and 120.

The gate line 112, the gate electrode 112a, and the gate pad 122 are located at the same layer. The data line 115, the source and drain electrodes 115a and 115b, and the data pad 125 are located at the same layer. The pixel electrode 117 and the first and second oxidation preventing films 152 and 155 are located at the same layer.

The TFT array substrate according to the present invention is characterized by depositing the first to third passivation films 116, 118, and 120 which have different etching selectivities. The third passivation film 120 is formed such that the third passivation film 120 overlaps with the non-opening regions, such as TFT, the gate line 112, and the data line 115. The third passivation film 120 is removed at the opening regions at which the pixel electrode 117 and the first and second oxidation preventing films 152 and 155 are formed. In other words, the pixel electrode 117 and the first and second oxidation preventing films 152 and 155 are formed only at the region where the third passivation film 120 is removed.

The second passivation film 118 is made of an organic insulating material having a low dielectric constant, such as benzocyclobutene (BCB) or acrylic resin. Consequently, little parasitic capacitance is generated when the data line 115 overlaps with the edge of the pixel electrode 117. In this way, it is possible to arrange the data line 115 and the pixel electrode 117 such that the data line 115 overlaps with the pixel electrode 117, and therefore, it is possible to interpose the second passivation film 118 between the data line 115 and the pixel electrode 117 so as to maximally increase the area of the pixel electrode 117. Consequently, it is possible to improve the opening ratio of the device.

Although not shown, the TFT array substrate having the pixel electrode 117 and the TFT is coupled with another substrate having a common electrode and a color filter layer while the two substrates are opposite to each other, and then a space defined between the two substrates is filled with liquid crystal, thereby completing a liquid crystal display device. The liquid crystal is driven by a vertical electric field created between the pixel electrode 117 and the common electrode.

Figure 4A:
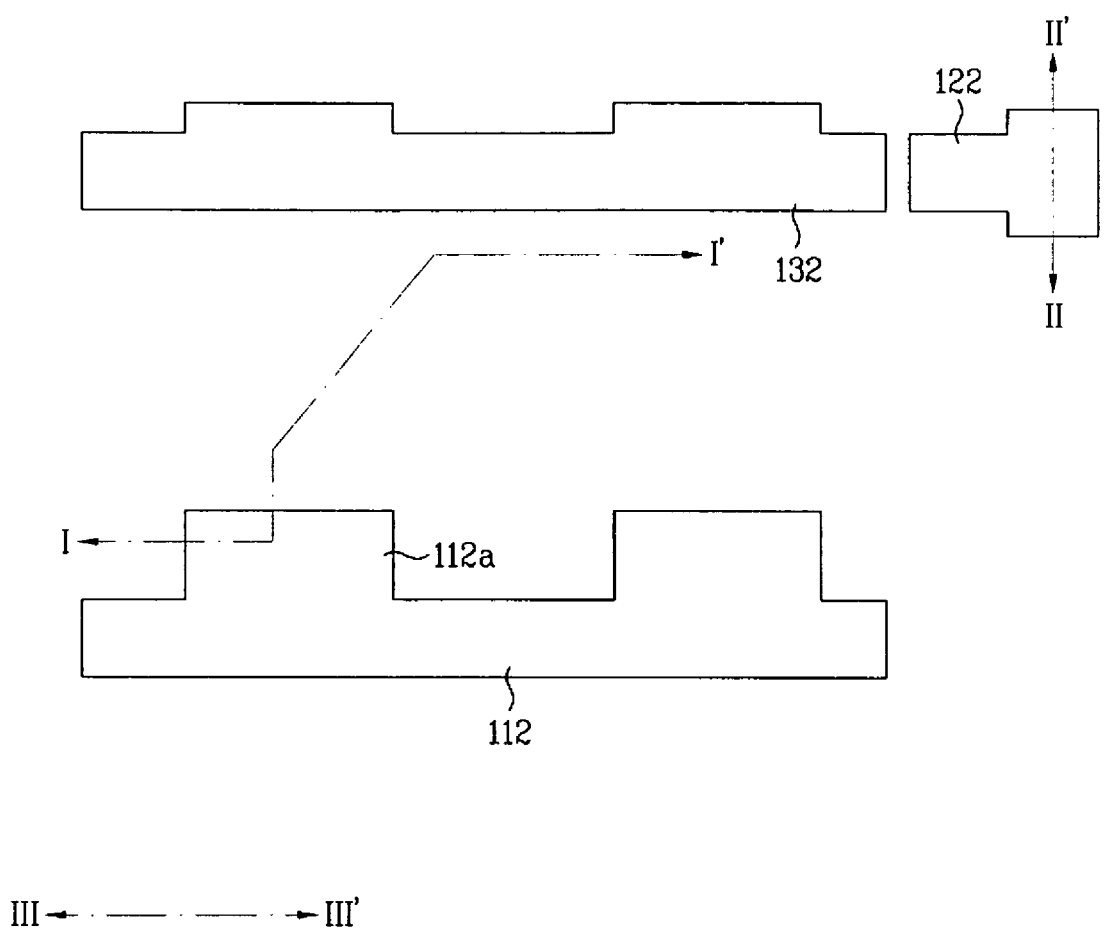
FIGS. 4A to 4C are plan views illustrating a process for manufacturing the TFT array substrate according to the first embodiment of the present invention.
Figure 5A:
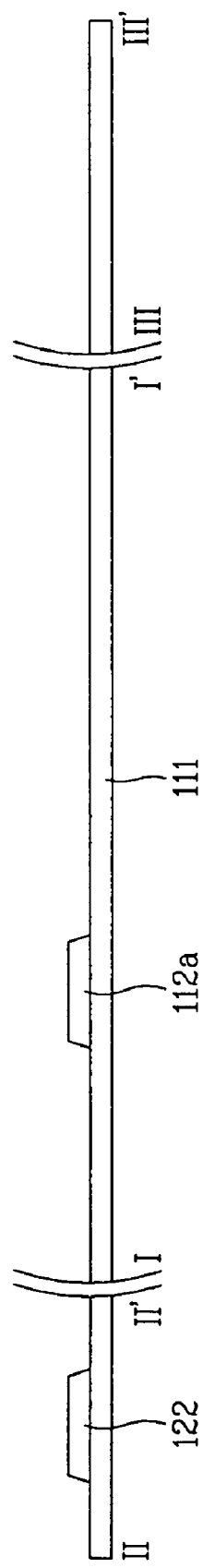

So as to form the TFT array substrate for liquid crystal display devices, as shown in FIGS. 4A and 5A, a metal material, such as copper (Cu), copper alloy, aluminum (Al), aluminum neodymium (AlNd), molybdenum (Mo), molybdenum alloy, chrome (Cr), chrome alloy, titanium (Ti), titanium alloy, silver (Ag), or silver alloy, preferably deposited films of molybdenum and aluminum neodymium, are sequentially deposited on a transparent substrate 111 having high heat resistance by sputtering. Subsequently, the deposited films of molybdenum and aluminum neodymium are patterned in a batch fashion through a photolithography process and an etching process using a first exposure mask to form a gate line 112, a gate electrode 112a diverging from the gate line 112 and located at a TFT region, and a gate pad 122 located at the gate pad region.

Figure 4B:
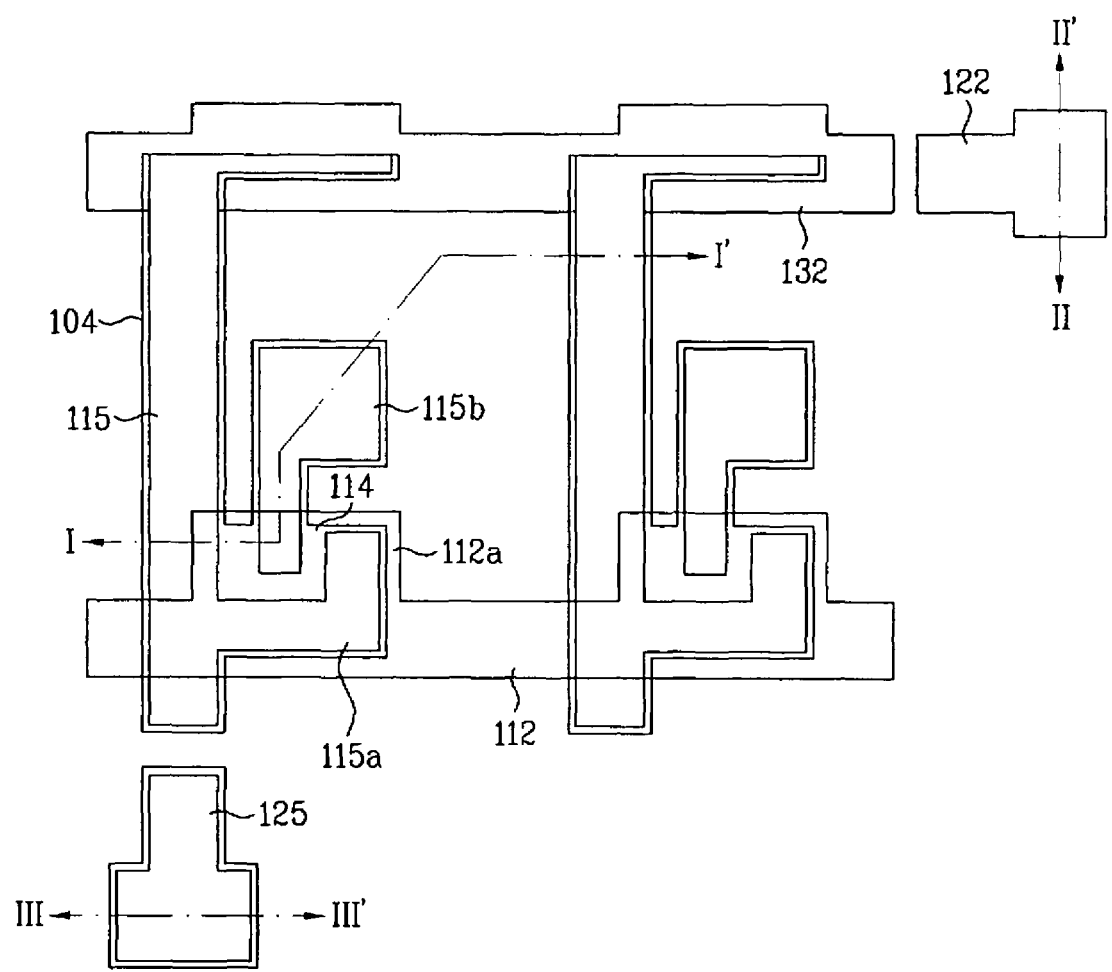
Figure 4C:
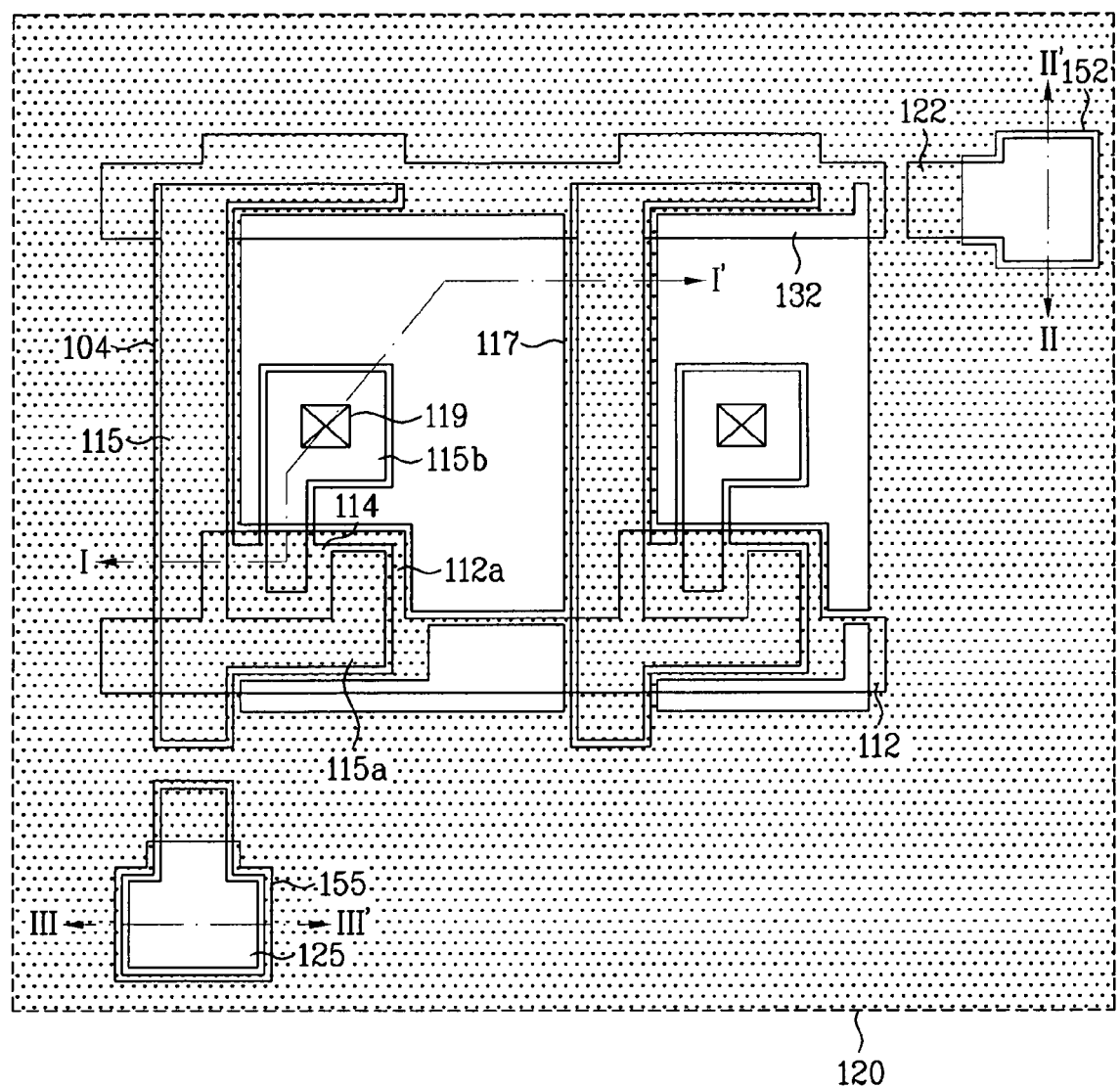
Figure 5B:
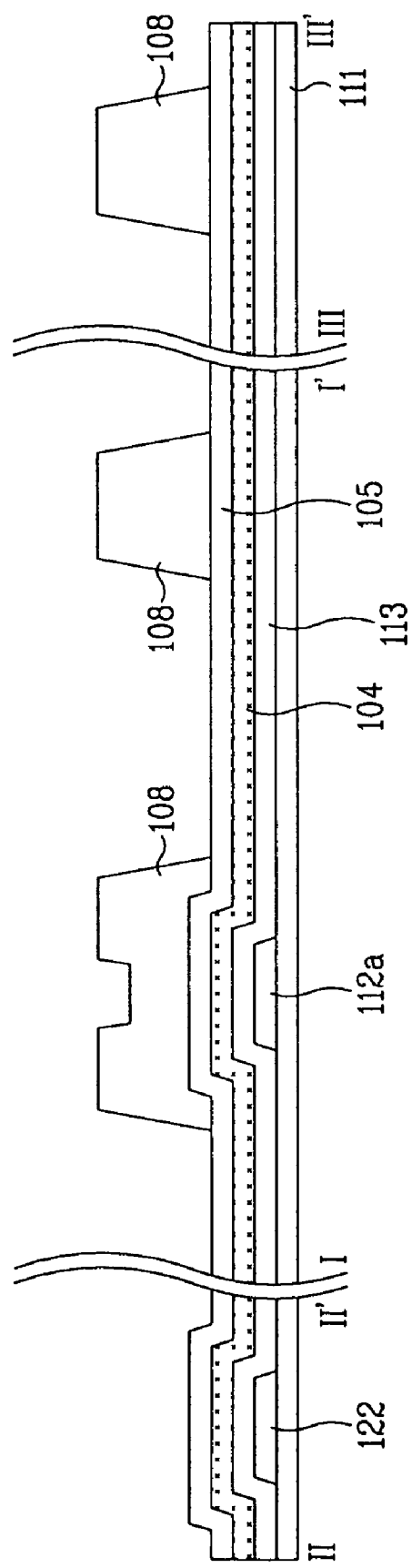

Subsequently, as shown in FIGS. 4B and 5B, an inorganic material, such as silicon nitride (SiNx) or silicon oxide (SiOx), is deposited on the front surface of the substrate 111 including the gate electrode 112a at high temperature so as to form a gate insulation film 113.

Subsequently, amorphous silicon (a-Si) 104 and a metal material 105 are sequentially deposited on the gate insulation film 113. The metal material 105 may include copper (Cu), copper alloy, aluminum (Al), aluminum neodymium (AlNd), molybdenum (Mo), molybdenum alloy, chrome (Cr), chrome alloy, titanium (Ti), titanium alloy, silver (Ag), or silver alloy.

Subsequently, a semi-transmission exposure mask or a diffraction exposure mask is used to pattern the deposited films of amorphous silicon (a-Si) 104 and metal material 105 in a batch fashion. Specifically, photoresist, which is ultraviolet (UV) curable resin, is applied to the metal material 105 using a spin method or a roll coating method. After that, a second exposure mask having a predetermined pattern is placed on the photoresist, and UV rays or x-rays are irradiated to the photoresist such that the photoresist is exposed. Subsequently, the exposed photoresist is developed to form a first photoresist pattern 108 having a double step structure.

A semi-transmission exposure mask or a diffraction exposure mask is used as a second exposure mask so as to form the first photoresist pattern 108 in the shape of a double step. A shading layer of a metal material and a diffraction layer of a metal material are formed on the transparent substrate, and therefore, the diffraction exposure mask is divided into three regions, i.e., a transmission region, a diffraction region, and a shading region. The transmission region has a light transmissivity of 100%, the shading region has a light transmissivity of 0%, and the diffraction region has a light transmissivity higher than 0% and lower than 100%.

Consequently, the remaining thickness of the diffraction-exposed first photoresist pattern 108 is divided into three parts, i.e., a part where the first photoresist pattern 108 is aligned with the transmission region of the diffraction exposure mask and the photoresist is completely removed in a subsequent developing process, a part where the first photoresist pattern 108 is aligned with the shading region of the diffraction exposure mask and the photoresist is not removed in a subsequent developing process, and a part where the first photoresist pattern 108 is aligned with the diffraction region of the diffraction exposure mask and the photoresist is partially removed in a subsequent developing process.

As a result, the diffraction-exposed and developed first photoresist pattern 108 has a double step structure. Specifically, the photoresist is not removed at a region where source and drain electrodes are formed and at a region where a data line and a data pad are formed, and the photoresist at a channel region between the source electrode and the drain electrode has an intermediate step.

Subsequently, the deposit films of amorphous silicon and metal material are etched using the first photoresist pattern 108 having the double step structure as a mask in a batch fashion so as to form a data line 115, a semiconductor layer 114 located at the TFT region, deposited films of source and drain electrodes 115a and 115b, and a data pad 125 located at the data pad region. At this time, the source electrode 115a and the drain electrode 115b are integrally connected with each other. The semiconductor layer 114 is located below the source electrode 115a and the drain electrode 115b in the same pattern, and the amorphous silicon 104 is located below the data line 115 and the data pad 125 in the same pattern.

Subsequently, the first photoresist pattern 108 is ashed until the lower step part of the first photoresist pattern 108 is completely removed. A region between the source electrode and the drain electrode exposed through the ashed first photoresist pattern is etched to separate the source electrode 115a and the drain electrode 115b from each other. The semiconductor layer 114 between the source electrode 115a and the drain electrode 115b will be a channel region.

Consequently, the amorphous silicon 104 is located below the data line 115 and the data pad 125 in the same pattern, and the semiconductor layer 114, which includes the channel region and is made of an amorphous silicon material, is located below the source electrode 115a and the drain electrode 115b.

The gate electrode 112a, the semiconductor layer 114 formed on the gate insulation film 13 above the gate electrode 112a, and the source and drain electrodes 115a and 115b formed at opposite ends of the semiconductor layer 114 constitute a thin film transistor.

Figure 5C:
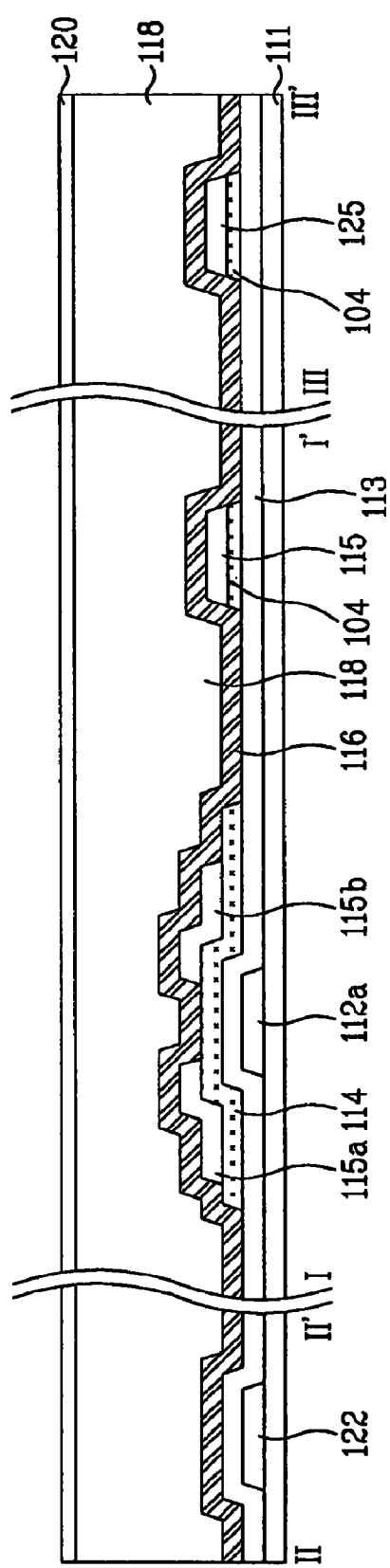

Subsequently, as shown in FIG. 5C, the remaining first photoresist pattern 108 is completely removed. An inorganic insulating material, such as silicon nitride (SiNx), is deposited on the front surface of the substrate 111 including the source and drain electrodes 115a and 115b so as to form a first passivation film 116. An organic insulating material, such as benzocyclobutene (BCB) or acrylic resin, is applied to the first passivation film 116 so as to form a second passivation film 118. Silicon dioxide (SiO2) is deposited on the second passivation film 118 so as to form a third passivation film 120.

Figure 5D:
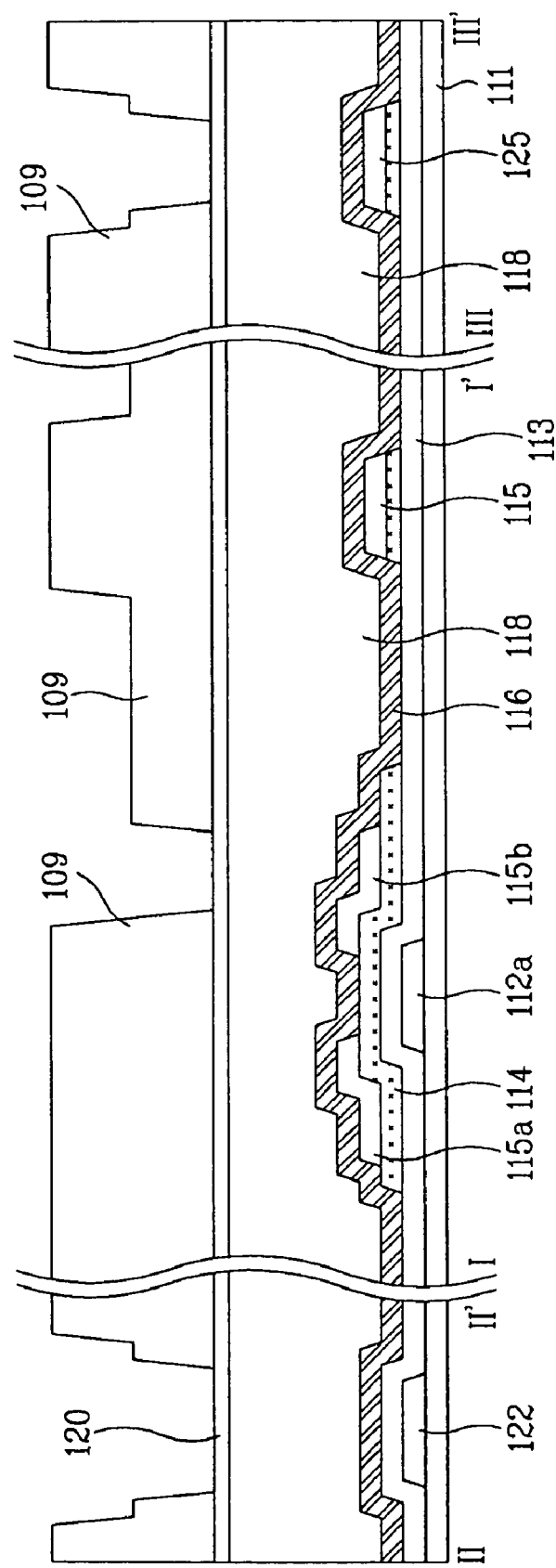

Subsequently, as shown in FIG. 5D, photoresist is applied to the third passivation film 120. The photoresist is exposed while a third exposure mask having a predetermined pattern is placed on the photoresist. The exposed photoresist is developed so as to form a second photoresist pattern 109 having a double step structure.

A diffraction exposure mask is used as a third exposure mask so as to form the second photoresist pattern 109 in the shape of a double step. As previously described, the diffraction exposure mask is divided into three regions, i.e., a transmission region, a diffraction region, and a shading region. Also, the remaining thickness of the diffraction-exposed second photoresist pattern 109 is divided into three parts.

Specifically, the photoresist is completely removed at a region where the gate pad 122 and the data pad 125 will be opened, the photoresist has an intermediate step at a region where a pixel electrode will be formed, and the photoresist is not removed at the remaining region.

Figure 5E:
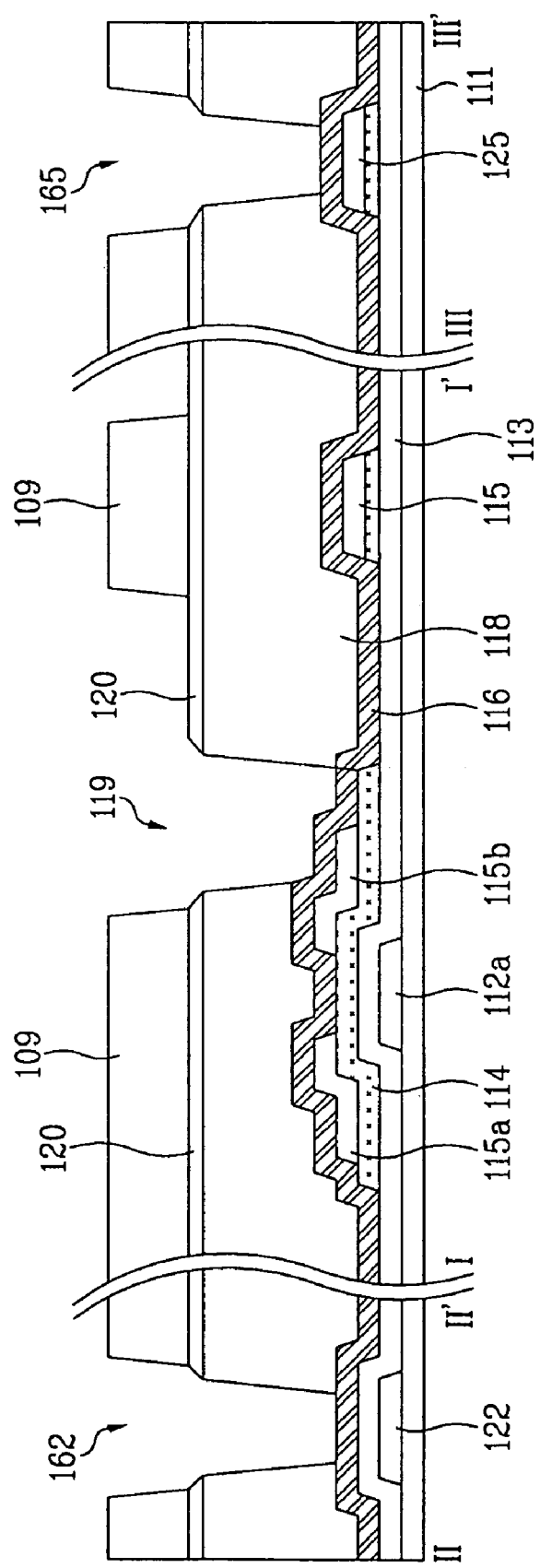

Subsequently, as shown in FIG. 5E, the third passivation film 120 is etched through a dry etching process using induced coupled plasma (ICP) while the second photoresist pattern 109 having the double step structure is used as a mask. Also, the second passivation film 118 is ashed through an ashing process using oxygen (O2) plasma. In the ashing process using oxygen plasma, an organic film is ashed, and therefore, the first passivation film 116, which is made of an inorganic insulating material, is not ashed, but the step of the second photoresist pattern 109 is lowered. Specifically, the second photoresist pattern 109 is removed at the intermediate step corresponding to a region where a pixel electrode will be formed in a subsequent process. As a result, the third passivation film 120 is exposed, and the height of the second photoresist pattern 109, which has a relatively high step, is decreased.

Figure 5F:
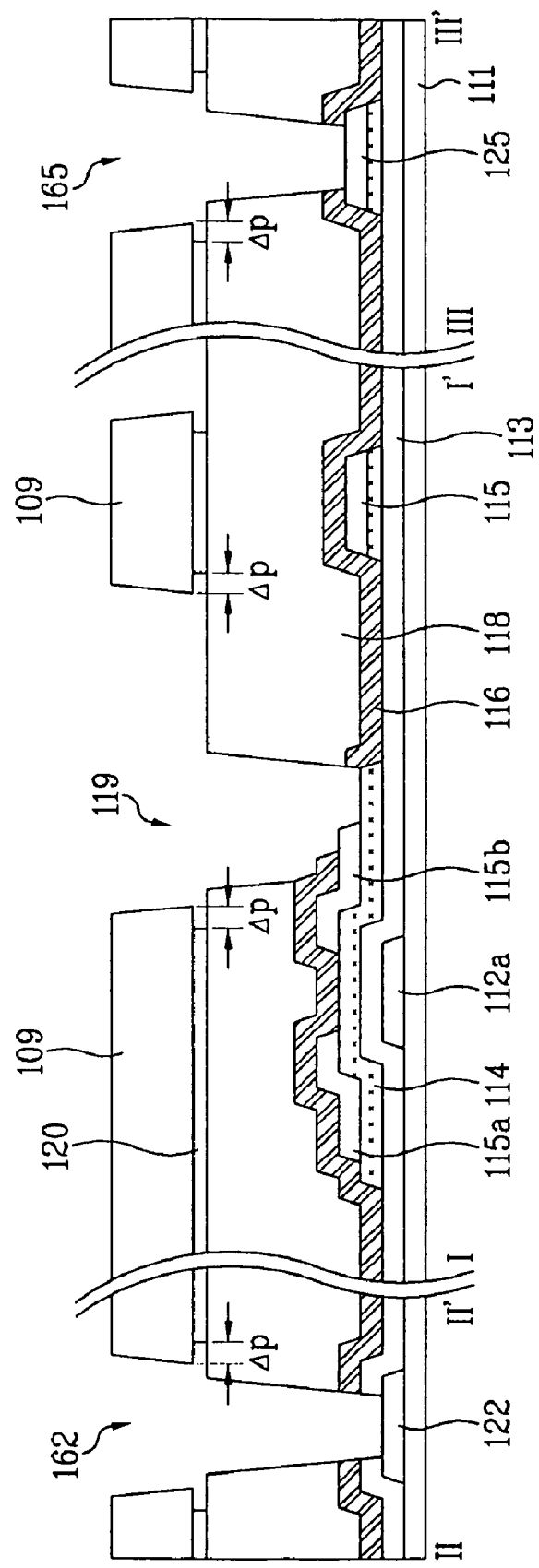

Subsequently, as shown in FIG. 5F, the first passivation film 116 or the gate insulation film 113 are etched, using the drain electrode 115b, the gate pad 122, and the data pad 125 as an etching stopper, so as to form a contact hole 119 through which the drain electrode 115b is exposed, a first opening region 162 through which the gate pad 122 is exposed, and a second opening region 165 through which the data pad 125 is exposed. At this time, the third passivation film 120, which is made of silicon dioxide (SiO2), is simultaneously etched. As a result, a gap difference of ΔP occurs between the second photoresist pattern 109 and the third passivation film 120, and the second passivation film 118 is exposed at a region where a pixel electrode will be formed. A stripper is used to lift off the second photoresist pattern 109 in a subsequent process. The gap difference of ΔP will be a stripper penetration space where the lift-off stripper penetrates between the second photoresist pattern 109 and the third passivation film 120.

Specifically, the first passivation film 116, the gate insulation film 113, and the third passivation film 120 are etched through a wet etching process using a HF-based and/or NH4F-based etchant, for example, a buffered oxide etchant (BOE).

Especially, the third passivation film 120 is rapidly and excessively etched in the horizontal direction by the etchant penetrating between interfaces of the second photoresist pattern 109 and the second passivation film 118. As a result, each side of the patterned third passivation film 152 is located inward by the gap difference of ΔP in the horizontal direction as compared with each edge of the second photoresist pattern 109. As the gap difference of ΔP between the third passivation film 120 and the second photoresist pattern 109 is further increased, the lift-off efficiency is improved in a subsequent process, whereby it is possible to more efficiently remove the second photoresist pattern 109.

Subsequently, as shown in FIG. 5G, a transparent conductive material 117a, such as indium tin oxide (ITO), indium zinc oxide (IZO), aluminum zinc oxide (AZO), or zinc oxide (ZnO), is deposited on the front surface of the substrate 111 including the second photoresist pattern 109 such that the transparent conductive material 117a has a uniform thickness.

Figure 5H:
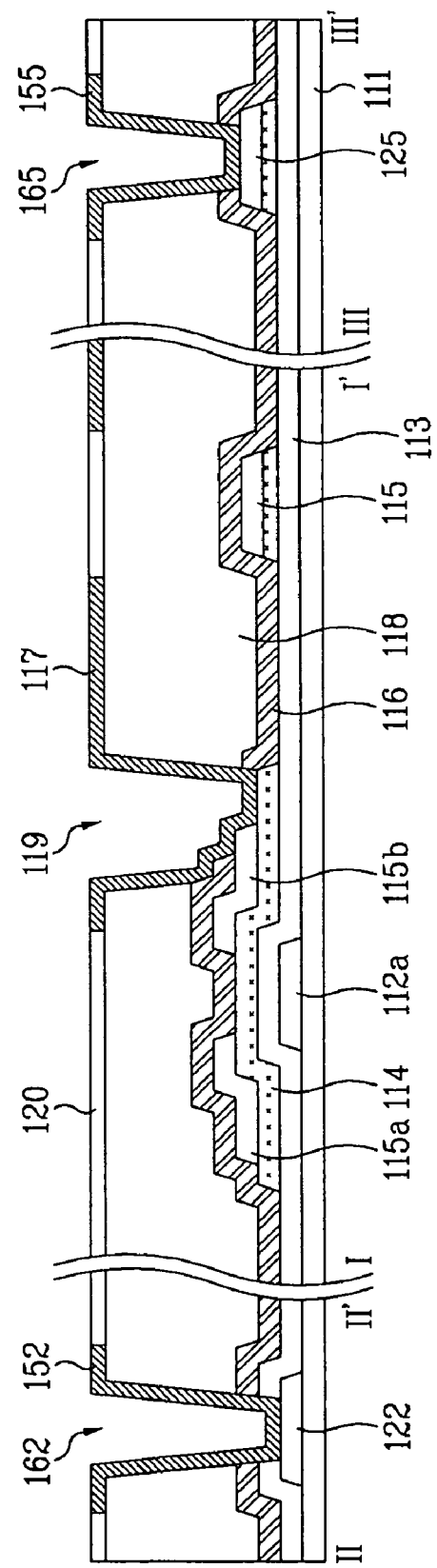

When the second photoresist pattern 109 is lifted off, the second photoresist pattern 109 and the transparent conductive material 117a deposited on the second photoresist pattern 109 are simultaneously removed. The remaining transparent conductive material 117a will be a pixel electrode 117 and first and second oxidation preventing films 152 and 155, as shown in FIG. 5H.

The pixel electrode 117 contacts the drain electrode 115b through the contact hole 119. The first and second oxidation preventing films 152 and 155 cover the gate pad 122 and the data pad 125, respectively, such that the gate pad 122 and the data pad 125 are not exposed to the outside, thereby preventing the oxidation of the gate pad 122 and the data pad 125.

For reference, the pixel electrode 117 and the first and second oxidation preventing films 152 and 155 are formed by depositing a transparent conductive material on a region where the second photoresist pattern 109 and the third passivation film 120 are not located. Consequently, the pixel electrode 117 and the first and second oxidation preventing films 152 and 155 have the same structure as that formed only at a region where the third passivation film 120 is removed.

The TFT array substrate with the above-stated construction according to the present invention is characterized in that exposure masks are used at a first step of forming a gate line layer, a second step of patterning amorphous silicon and a metal material using a diffraction exposure mask in a batch fashion to form a semiconductor layer and a data line layer, and a third step of patterning a first passivation film which is made of an inorganic insulating material, a second passivation film which is made of an organic insulating material, and a third passivation film which is made of silicon dioxide ($SiO_2$) using a diffraction exposure mask in a batch fashion to form a contact hole and opening regions, excessively etching the third passivation film below a photoresist pattern in the horizontal direction to form a gap difference of $\Delta P$, and penetrating a stripper into the gap difference of $\Delta P$, such that a lift-off process of the photoresist pattern is easily carried out, to form a pixel electrode and oxidation preventing films, whereby the number of mask processes is reduced. In other words, the exposure masks are used a total of three times, and therefore, the present invention is useful as a low-mask technology.

Second Embodiment

First and second steps of the second embodiment are identical to those of the first embodiment; however, a third step of the second embodiment is different from that of the first embodiment. Specifically, the second embodiment is identical to the first embodiment in that a gate line layer is formed using a first exposure mask at the first step, and a semiconductor layer and a data line layer are formed using a diffraction exposure mask as a second exposure mask in a batch fashion at the second step. However, the second embodiment is different from the first embodiment at the third step of forming a contact hole, opening regions, a pixel electrode, and oxidation preventing films.

Hereinafter, the third step of the second embodiment will be described in detail.

FIGS. 6A to 6F are sectional views illustrating a process for manufacturing a TFT array substrate according to a second embodiment of the present invention.

Figure 6A:
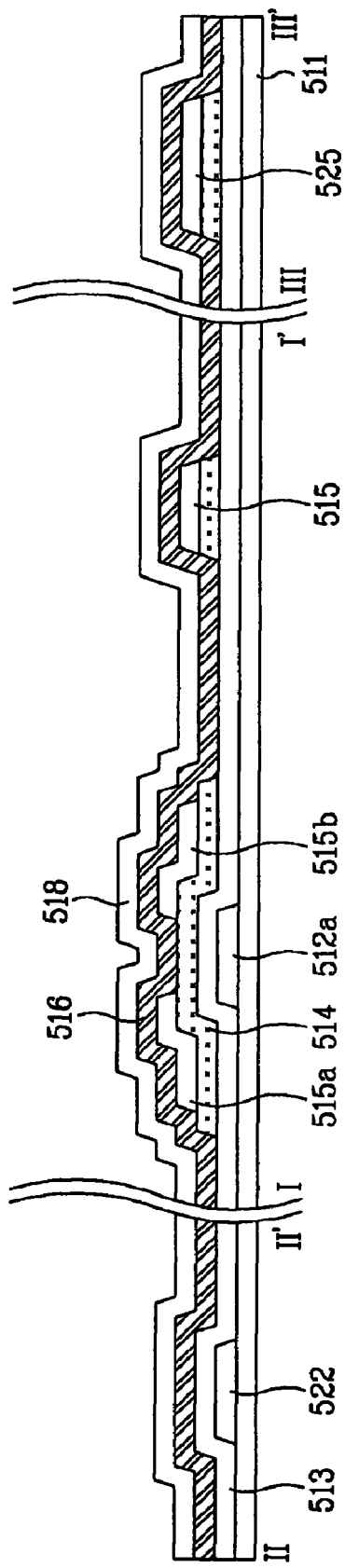
FIGS. 6A to 6F are sectional views illustrating a process for manufacturing a TFT array substrate according to a second embodiment of the present invention.

First, as shown in FIG. 6A, an inorganic insulating material, such as silicon nitride (SiNx), is deposited on the front surface of a substrate 511 having source and drain electrodes 515a and 515b, a data line 515, and a data pad 525 formed through the second step so as to form a first passivation film 516. Silicon dioxide (SiO2) is deposited on the first passivation film 516 so as to form a second passivation film 518.

Figure 6B:
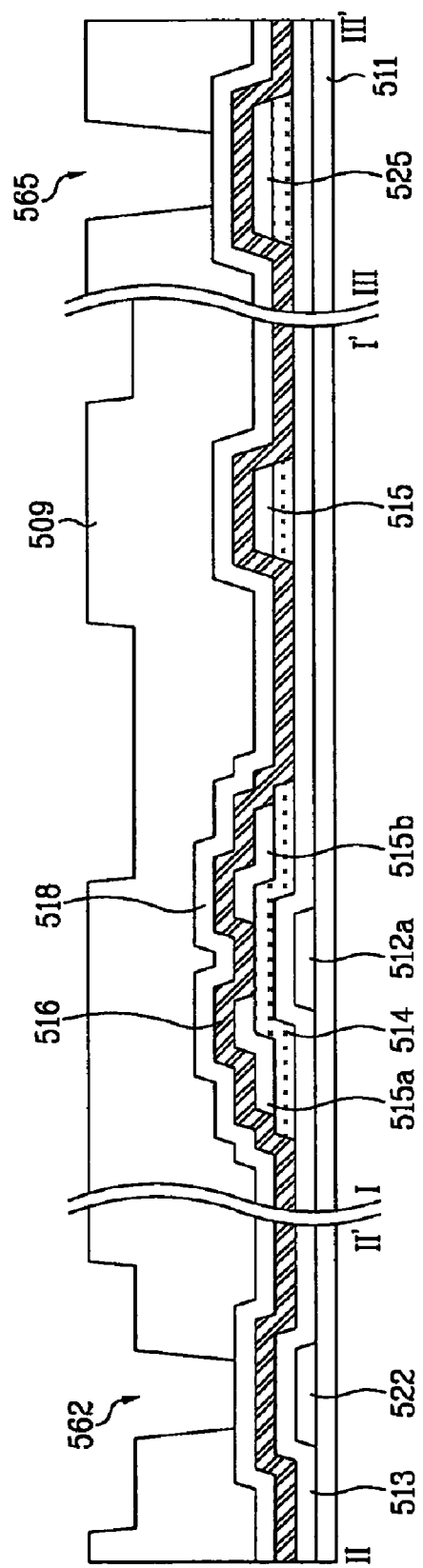

Subsequently, as shown in FIG. 6B, photoresist is applied to the second passivation film 518. The photoresist is exposed while a third exposure mask having a predetermined pattern is placed on the photoresist. The exposed photoresist is developed so as to form a photoresist pattern 509 having a double step structure.

A semi-transmission exposure mask or diffraction exposure mask is used as a third exposure mask so as to form the photoresist pattern 509 in the shape of a double step. As previously described, the diffraction exposure mask is divided into three regions, i.e., a transmission region, a diffraction region, and a shading region. Also, the remaining thickness of the diffraction-exposed photoresist pattern 509 is divided into three parts.

Specifically, the photoresist is completely removed at a region where a gate pad 522 and the data pad 525 will be opened, the photoresist has an intermediate step at a region where a pixel electrode will be formed, and the photoresist is not removed at the remaining region.

Figure 6C:
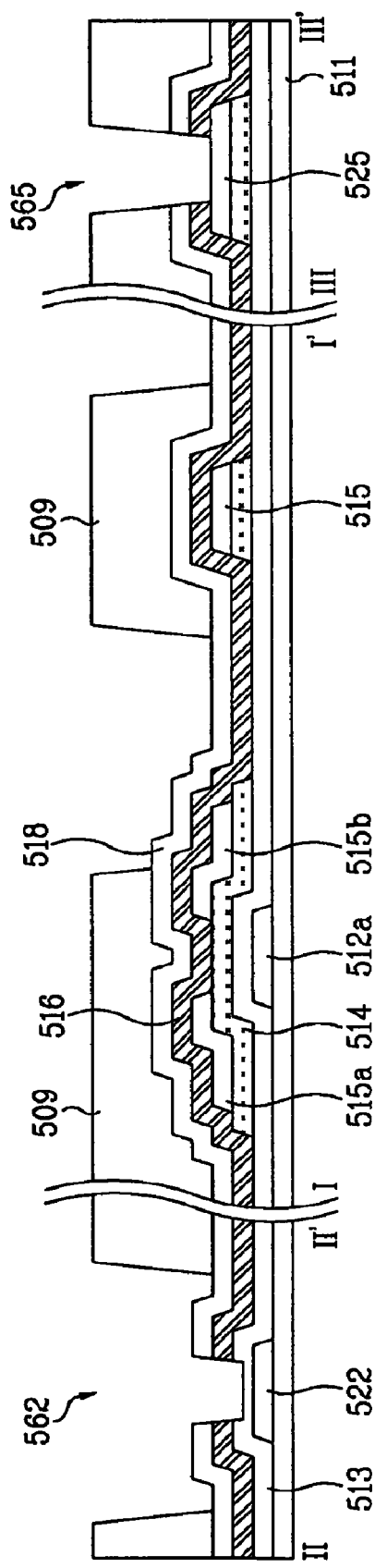

Subsequently, as shown in FIG. 6C, first and second passivation films 516 and 518 are etched through a dry etching process using the photoresist pattern 509 having the double step structure as a mask so as to form first and second opening regions 562 and 565. A gate insulation film 513 located on the gate pad 522 is exposed through the first opening region 562, and the data pad 525 is exposed through the second opening region 565.

Subsequently, the photoresist pattern 509 having the double step structure is ashed through an ashing process using oxygen (O2) plasma. Consequently, the photoresist pattern 509 is removed at the intermediate step corresponding to a region where a pixel electrode will be formed in a subsequent process. As a result, the second passivation film 518 is exposed, and the height of the photoresist pattern 509, which has a relatively high step, is decreased. Not only the height of the photoresist pattern 509 is reduced but also the photoresist pattern 509 is ashed in the lateral direction through the ashing process. Consequently, as shown in FIG. 6C, the width of the first opening region 562 is increased, and the edges of the first and second passivation films 516 and 518 are exposed through the first opening region 562.

It should be noted that the gate insulation film 513 on the gate pad 522 is not completely removed even after performing the process for dry etching the first and second passivation films 516 and 518 and the process for ashing the photoresist pattern 509. The reason to leave the gate insulation film 513 on the gate pad 522 is to prevent the surface of the gate pad 522 from being damaged in a subsequent wet etching process.

For example, when the gate insulation film 513, the first passivation film 516, and the second passivation film 518 are formed such that the gate insulation film 513, the first passivation film 516, and the second passivation film 518 have thicknesses of 4000 Å, 2000 Å, and 1000 Å, respectively, the gate insulation film 513 is left on the gate pad 522 while the gate insulation film 51 has a thickness of approximately 1000 Å.

Figure 6D:
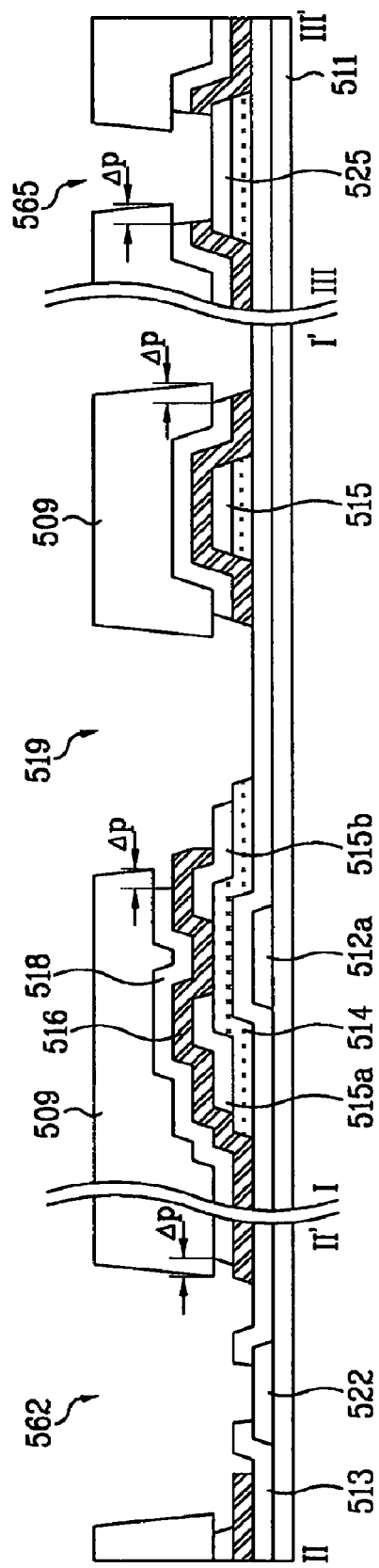

Subsequently, as shown in FIG. 6D, the first and second passivation films 516 and 518 are wet-etched using the ashed photoresist pattern 509 as a mask. As a result, a contact hole 519, through which the gate insulation film 513 including the drain electrode is exposed to the outside, is formed at a region where a pixel electrode will be formed, and the remaining gate insulation film 513 is completely removed from the first opening region 562.

At this time, the edges of the first and second passivation films 516 and 518 exposed through the ashed photoresist pattern 509 are also etched. The etching speed of the first and second passivation films 516 and 518 is changed due to an etchant used during the wet etching. Specifically, the second passivation film 518 is more rapidly etched in the horizontal direction than the first passivation film 516. As a result, a gap difference of ΔP occurs between the second passivation film 518 and the photoresist pattern 509. The gap difference of ΔP will be a stripper penetration space where a lift-off stripper, which is used to lift off the photoresist pattern 509 in a subsequent process, penetrates between the photoresist pattern 509 and the second passivation film 518.

Specifically, when the first passivation film 516 and the second passivation film 518 are etched through a wet etching process using a HF-based and/or NH$_4$F-based etchant, for example, a buffered oxide etchant (BOE), the etching speed ratio between the first passivation film 516, which is made of silicon nitride (SiNx), and the second passivation film 518, which is made of silicon dioxide (SiO$_2$) is approximately 1:5. It is possible to easily form the gap difference of ΔP through the use of the BOE.

Especially, the second passivation film 518 is rapidly and excessively etched in the horizontal direction by the BOE penetrating between the photoresist pattern 509 and the first passivation film 516. As a result, each side of the patterned second passivation film 518 is located inward by the gap difference of ΔP in the horizontal direction as compared with each edge of the photoresist pattern 509. As the gap difference of ΔP between the second passivation film 518 and the photoresist pattern 509 is further increased, the lift-off efficiency is improved in a subsequent process, whereby it is possible to more efficiently remove the photoresist pattern 509.

Figure 6E:
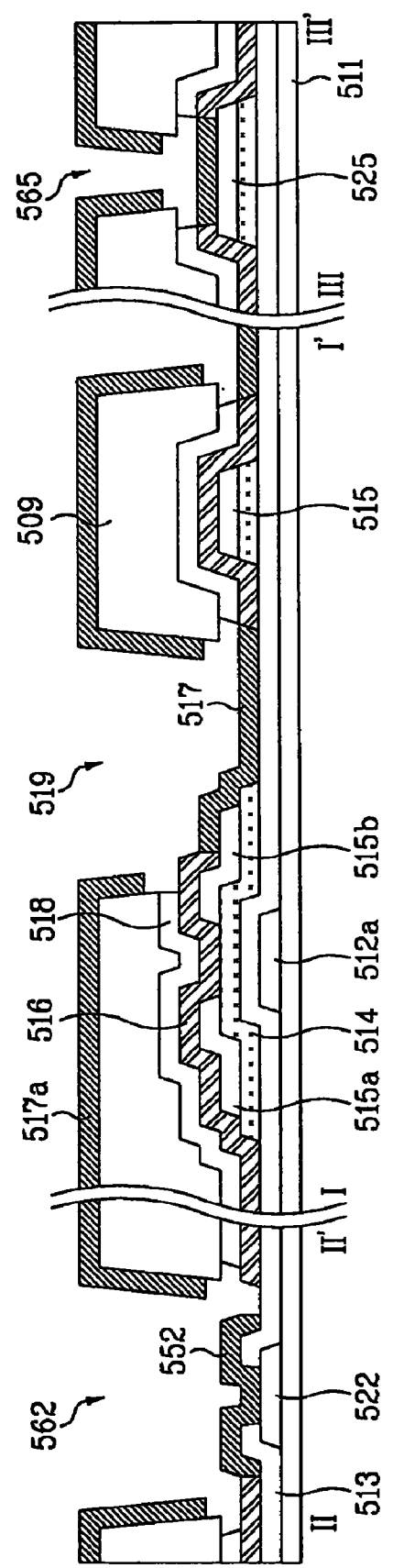

Subsequently, as shown in FIG. 6E, a transparent conductive material 517a, such as indium tin oxide (ITO), indium zinc oxide (IZO), aluminum zinc oxide (AZO), or zinc oxide (ZnO), is deposited on the front surface of the substrate 511 including the photoresist pattern 509 such that the transparent conductive material 517a has a uniform thickness.

Figure 6F:
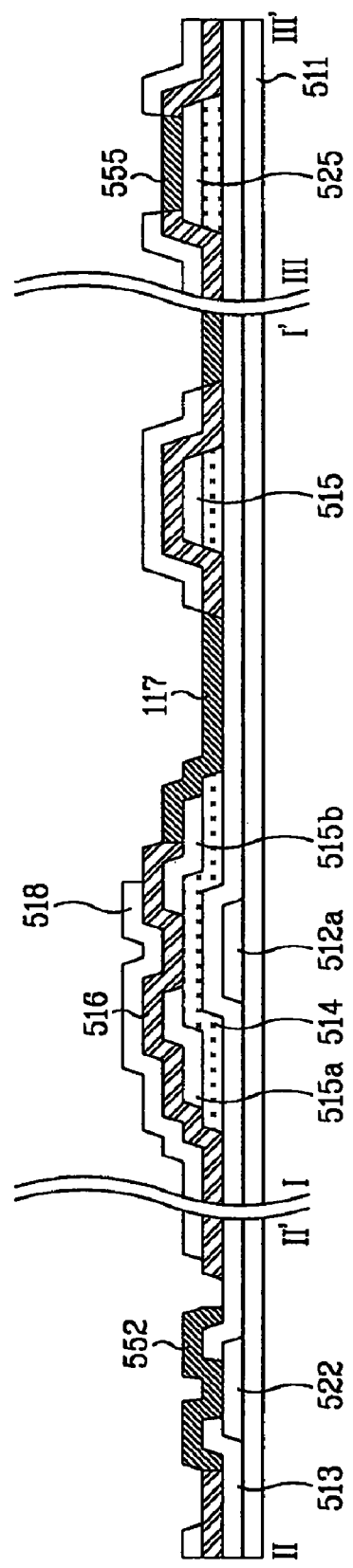

When the photoresist pattern 509 is lifted off, the photoresist pattern 509 and the transparent conductive material 517a deposited on the photoresist pattern 509 are simultaneously removed. The remaining transparent conductive material 517a will be a pixel electrode 517 and first and second oxidation preventing films 552 and 555, as shown in FIG. 6F.

The pixel electrode 517 directly contacts the drain electrode 515b exposed to the outside. The pixel electrode 517 is formed in the contact hole 519. The first and second oxidation preventing films 552 and 555 cover the gate pad 522 and the data pad 525, respectively, such that the gate pad 522 and the data pad 525 are not exposed to the outside, thereby preventing the oxidation of the gate pad 522 and the data pad 525.

For reference, the pixel electrode 517 and the first and second oxidation preventing films 552 and 555 are formed by depositing a transparent conductive material on a region where the photoresist pattern 509 and the second passivation film 518 are not located. Consequently, the pixel electrode 517 and the first and second oxidation preventing films 552 and 555 have the same structure as that formed only at a region where the second passivation film 518 is removed.

In the TFT array substrate with the above-stated construction according to the present invention is characterized in that exposure masks are used at a first step of forming a gate line layer, a second step of patterning amorphous silicon and a metal material using a diffraction exposure mask in a batch fashion to form a semiconductor layer and a data line layer, and a third step of patterning first and second passivation films having different etching selectivities using a diffraction exposure mask in a batch fashion to form a contact hole and opening regions, excessively etching the second passivation film below a photoresist pattern in the horizontal direction to form a gap difference of ΔP, and penetrating a stripper into the gap difference of ΔP, such that a lift-off process of the photoresist pattern is easily carried out, to form a pixel electrode and oxidation preventing films, whereby the number of mask processes is reduced. In other words, the exposure masks are used a total of three times, and therefore, the present invention is useful as a low-mask technology.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As apparent from the above description, the TFT array substrate and the method of manufacturing the same according to the present invention have the following effects.

First, exposure masks are used at a first step of forming a gate line layer, a second step of patterning amorphous silicon and a metal material using a diffraction exposure mask in a batch fashion to form a semiconductor layer and a data line layer, and a third step of patterning a first passivation film which is made of an inorganic insulating material, a second passivation film which is made of an organic insulating material, and a third passivation film which is made of silicon dioxide (SiO$_2$) using a diffraction exposure mask in a batch fashion to form a contact hole and opening regions, excessively etching the third passivation film below a photoresist pattern in the horizontal direction to form a gap difference of ΔP, and forming a pixel electrode and oxidation preventing films through a lift-off process of the photoresist pattern. In other words, the exposure masks are used a total of three times to form the TFT array substrate.

As the number of usage of the exposure masks is decreased as described above, it is possible to reduce the process time and the process costs.

On the other hand, the third step may be carried out using a method of patterning first and second passivation films having different etching selectivities using a diffraction exposure mask in a batch fashion to form a contact hole and opening regions, excessively etching the second passivation film below a photoresist pattern in the horizontal direction to form a gap difference of ΔP, and forming a pixel electrode and oxidation preventing films through a lift-off process of the photoresist pattern.

Second, the second passivation film is made of an organic insulating material having a low dielectric constant. Consequently, it is possible to arrange the data line and the pixel electrode such that the data line overlaps with the pixel electrode, and therefore, it is possible to improve the opening ratio of the device. As a result, it is possible to solve a general opening ratio decrease problem which occurs as an organic insulation film is not used in a low-mask process.

Third, silicon dioxide (SiO$_2$) is etched using a buffered oxide etchant (BOE). Consequently, it is possible to more easily form a gap difference of ΔP than when using a conventional dry etching process, and therefore, it is possible to easily perform a lift-off process of the photoresist pattern.

What is claimed is:
1. A method of manufacturing a TFT array substrate, comprising:
forming a gate line layer including a gate line, a gate electrode, and a gate pad on a substrate;

forming a gate insulation film on the front surface of the substrate including the gate line layer;

forming a semiconductor layer overlapping with the gate electrode;

forming a data line layer including a data line intersecting the gate line, source and drain electrodes disposed at opposite sides of the semiconductor layer, and a data pad formed at the end of the data line;

forming an at least two-layered passivation film on the front surface of the substrate including the data line layer;

forming a photoresist pattern on the uppermost layer of the at least two-layered passivation film;

selectively etching the at least two-layered passivation film using the photoresist pattern as a mask to form a contact hole and first and second opening regions and, at the same time, excessively etching the uppermost layer of the at least two-layered passivation film below the photoresist pattern in the horizontal direction;

depositing a conductive material on the front surface of the substrate including the photoresist; and patterning the conductive material by lifting off the photoresist to form a pixel electrode contacting the drain electrode through the contact hole and first and second oxidation preventing films contacting the gate pad and the data pad through the first and second opening regions, wherein the step of forming the at least two-layered passivation film includes sequentially depositing first to third passivation films to cover the data line layer, and the step of forming the contact hole and the first and second opening regions and excessively etching the uppermost layer of the at least two-layered passivation film below the photoresist pattern in the horizontal direction includes etching the third passivation film through a dry etching process, ashing the second passivation film through an ashing process, and etching the first passivation film through a wet etching process.

2. The method according to claim 1, wherein
the photoresist pattern is completely removed at a region where the contact hole and the first and second opening regions is to be formed,
the photoresist pattern has an intermediate step at a region where the pixel electrode is to be formed, and
the photoresist pattern is not removed at the remaining region.

3. The method according to claim 2, wherein the photoresist pattern having the intermediate step is ashed and completely removed in the ashing process.

4. The method according to claim 2, wherein the first passivation film is etched using a buffered oxide etchant (BOE).

5. The method according to claim 4, wherein the step of etching the first passivation film using the BOE includes
excessively etching the third passivation film below the photoresist pattern in the horizontal direction.

6. The method according to claim 2, wherein the first passivation film is made of an inorganic insulating material such as silicon nitride (SiNx) or silicon oxide (SiOx),
the second passivation film is made of an organic insulating material such as benzocyclobutene (BCB) or acrylic resin, and
the third passivation film is made of silicon dioxide ($SiO_2$).

7. The method according to claim 1, wherein
the contact hole is formed by removing the at least two-layered passivation film above the drain electrode,
the first opening region is formed by removing the at least two-layered passivation film and the gate insulation film above the gate pad, and
the second opening region is formed by removing the at least two-layered passivation film above the data pad.

8. The method according to claim 7, wherein the contact hole is formed by removing the at least two-layered passivation film at a region where the at least two-layered passivation film overlaps with the pixel electrode.

9. The method according to claim 1, wherein the semiconductor layer and the data line layer are simultaneously formed using a diffraction exposure mask.

* * * * *